United States Patent
Agostini et al.

(10) Patent No.: US 8,978,403 B2
(45) Date of Patent: Mar. 17, 2015

(54) COOLING APPARATUS

(71) Applicant: ABB Research Ltd, Zürich (CH)

(72) Inventors: Bruno Agostini, Zürich (CH);
Francesco Agostini, Zofingen (CH);
Heikki Elomaa, Lohja (FI); Jari Sundelin, Espoo (FI); Mathieu Habert, Rheinfelden (CH)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 14/180,859

(22) Filed: Feb. 14, 2014

(65) Prior Publication Data

US 2014/0230485 A1  Aug. 21, 2014

(30) Foreign Application Priority Data

Feb. 15, 2013 (EP) ..................... 13155426

(51) Int. Cl.
*F25B 27/00* (2006.01)
*F25B 15/00* (2006.01)
*F25B 15/06* (2006.01)
*H01L 23/00* (2006.01)

(52) U.S. Cl.
CPC ............... *F25B 15/00* (2013.01); *F25B 15/06* (2013.01); *F25B 27/00* (2013.01); *H01L 23/00* (2013.01)
USPC ............................ 62/238.3; 62/259.2; 62/483

(58) Field of Classification Search
USPC ...................... 62/259.2, 238.3, 483
See application file for complete search history.

(56) References Cited

U.S. PATENT DOCUMENTS

| 2003/0016499 A1* | 1/2003 | Tanaka et al. ................. 361/700 |
| 2009/0178436 A1 | 7/2009 | Chiriac |
| 2011/0096503 A1 | 4/2011 | Avery et al. |

FOREIGN PATENT DOCUMENTS

WO    WO 2010/016842 A1    2/2010

OTHER PUBLICATIONS

Search Report mailed on Jul. 12, 2013, by the European Patent Office for Application No. 13155426.3.

* cited by examiner

*Primary Examiner* — Cassey D Bauer
(74) *Attorney, Agent, or Firm* — Buchanan Ingersoll & Rooney PC

(57) ABSTRACT

A cooling apparatus for electric equipment includes a generator configured to receive a heat load from first electric components, a evaporator configured to receive a heat load from second electric components, a closed compartment enclosing the generator and evaporator, and a absorber transferring heat from heated fluid to the outside of the closed compartment. To obtain an efficient and reliable cooling apparatus, the cooling apparatus includes a first expansion device which reduces the pressure of the fluid, and forwards the fluid in a liquid state and with a lower pressure to the secondary cooling element, which transfers heat to the received fluid from the second electric components for evaporating the fluid.

4 Claims, 1 Drawing Sheet

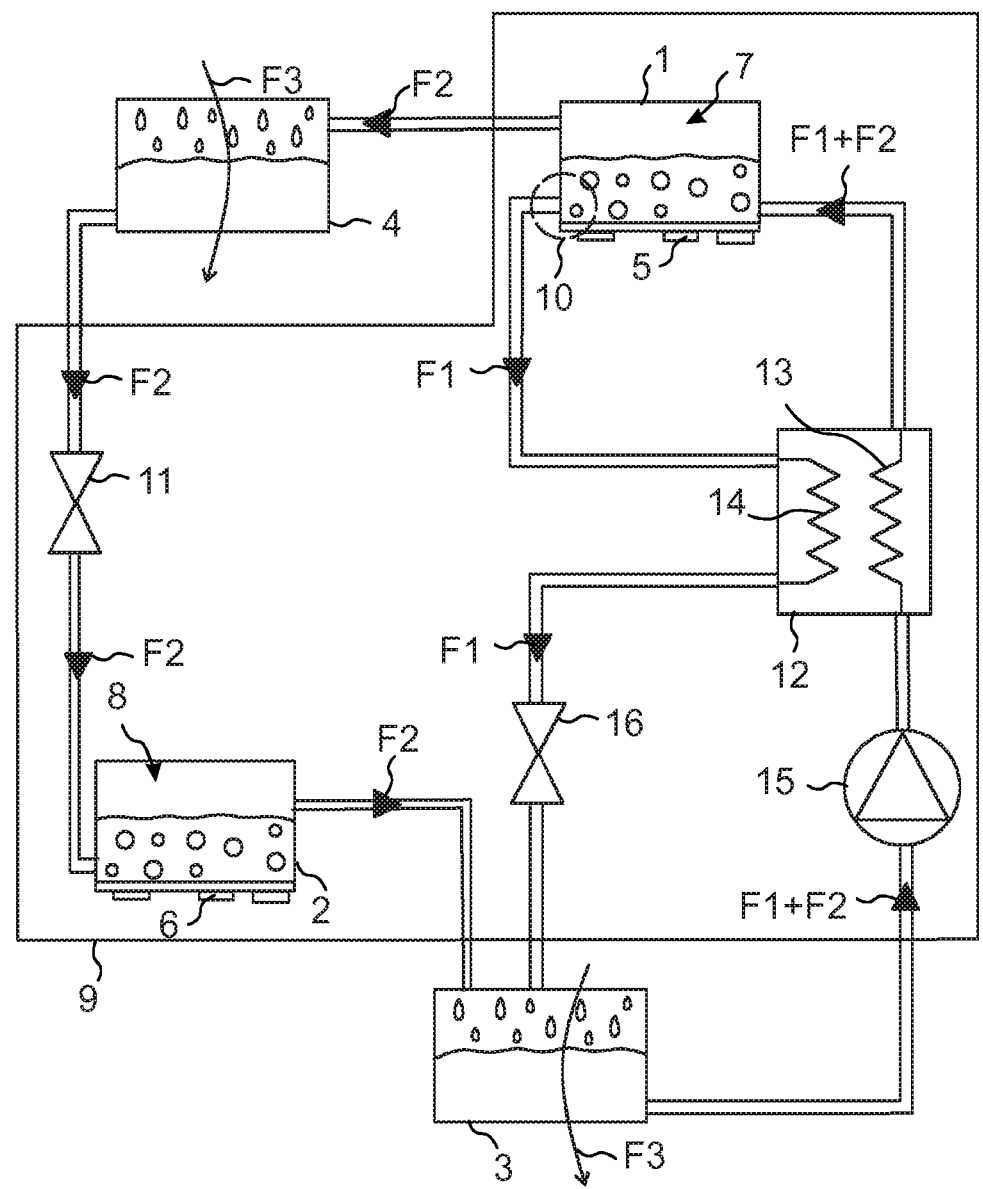

COOLING APPARATUS

RELATED APPLICATION

This application claims priority under 35 U.S.C. §119 to European Patent Application No. 13155426.3 filed in Europe on Feb. 15, 2013, the entire content of which is hereby incorporated by reference in its entirety.

FIELD

The present disclosure relates to a cooling apparatus for cooling electric equipment.

BACKGROUND INFORMATION

A known solution for cooling electric equipment involves evaporating a liquid in a cooling element which is used for transferring heat from electric components into a liquid in a fluid channel of the cooling element. The vaporized liquid is led to another cooling element where heat is transferred to a coolant such that liquid is again obtained, and this liquid is returned to the first cooling element.

A drawback with a solution as described above is that components not producing sufficient heat to evaporate the liquid are difficult to cool.

SUMMARY

An exemplary embodiment of the present disclosure provides a cooling apparatus for electric equipment. The exemplary apparatus includes a closed compartment, and first and second electric components arranged inside of the closed compartment. An operating temperature of the second electric components is lower than an operating temperature of the first electric components. The exemplary apparatus also includes an absorber arranged outside of the closed compartment. The absorber is configured to receive heated fluids from within the closed compartment, and transfer heat from the heated fluid to the outside of the closed compartment. In addition, the exemplary apparatus includes a condenser arranged outside of the closed compartment. The condenser is configured to receive heated fluid from within the closed compartment and transfer heat from the heated fluid to the outside of the closed compartment. The exemplary apparatus also includes a generator arranged in the closed compartment. The generator includes a fluid channel configured to receive a first fluid and a second fluid in a liquid state, the first and the second fluids being miscible, to heat the received liquids with heat received from the first electric components, to provide the condenser with the vaporized second fluid in a gas state, and to provide the absorber with the first fluid in a liquid state. Further, the exemplary apparatus includes a first expansion device configured to receive the second fluid from the condenser in a liquid state at a first pressure, reduce the first pressure of the second fluid, and forward the second fluid in a liquid state and with a third pressure which is lower than the first pressure. The exemplary apparatus also includes an evaporator arranged in the closed compartment, the evaporator comprising a fluid channel configured to receive the second fluid from the first expansion device in a liquid state, to evaporate the second fluid with heat received from the second electric components, and to forward the evaporated second fluid in a gas state to the absorber. In addition, the exemplary apparatus includes a second expansion device configured to forward the first fluid in a liquid state from the generator to the absorber, to receive the first fluid at a second pressure, to reduce the pressure of the first fluid, and to forward to the absorber the first fluid with a fourth pressure which is lower than the second pressure. The absorber is configured to receive the first fluid in a liquid state from the generator, the second fluid being in a vaporized gas state from the evaporator, to absorb the vaporized second fluid by the first fluid in a liquid state to obtain a liquid of the miscible first and second fluids while transferring heat from the fluids to the outside of the closed compartment, and to provide the generator with the first and second fluids in a liquid state. The exemplary apparatus also includes a pump configured to increase for increasing a pressure of the first and second fluids provided by the absorber to the generator.

BRIEF DESCRIPTION OF THE DRAWINGS

Additional refinements, advantages and features of the present disclosure are described in more detail below with reference to exemplary embodiments illustrated in the drawings, in which:

FIG. 1 is a block diagram of an exemplary embodiment of a cooling apparatus according to the present disclosure.

DETAILED DESCRIPTION

Exemplary embodiments of the present disclosure solve the above-mentioned drawback by providing an efficient and reliable solution for cooling electric equipment.

FIG. 1 is a block diagram of an exemplary embodiment of a cooling apparatus. The cooling apparatus includes a generator 1 with first electric components 5. The term "generator" refers to a heat exchanger cooling electric components, and which generates heat into the fluid in the fluid channel of the generator by passing on the heat load from the electric components to the fluid. The cooling apparatus also includes a evaporator 2 with second electric components 6. The term "evaporator" refers to a heat exchanger cooling electric components by evaporating fluid in the fluid channel of the evaporator with the heat load from the electric components. In the illustrated exemplary embodiment, it has by way of example been assumed that the first electric components 5 are attached (such as connected with thermal grease, for instance) to the generator 1 and that the second electric components 6 are attached (such as connected with thermal grease, for instance) to the evaporator 2. Consequently, the generator and evaporator may be base plates for accommodating electric components, and the fluid channels may be arranged into these base plates (or heat sinks). This is, however, not necessary in all exemplary embodiments. An alternative is that one or both of the generator and evaporator includes fins on an outer surface, and that heat is transferred from the respective electric components to the corresponding generator or evaporator by an airflow and the fins, for instance. In any case, heat generated by the first electric components 5 are transferred to a fluid in a flow channel 7 in the generator 1, and correspondingly, heat generated by the second electric components 6 are transferred to a fluid in a flow channel 8 in the evaporator 2.

The first electric components 5 are components with a higher operating temperature than the second electric components 6. The first electric components 5 may include, for example, high power electronic devices such as an IGBT (Insulated Gate Bipolar Transistor), a Si/SiC power module (Silicone, Silicone Carbide), a LED (Light Emitting Diode) or other Silicon Carbide electronic components, which may have a high operating temperature, such as about 125° C. at 3 kW, for instance. The second electric components 6 may include, for example, components with a low operating temperature such as passive electric components like a capacitor, a PCB (Printed Circuit Board) or a surge arrestor, for instance. These components may have an operating temperature of about 65° C. at 300 W.

The generator 1 and the evaporator 2 are enclosed in a closed compartment 9. The compartment 9 may be an electrical cabinet sealing off electric devices from the surrounding environment, for instance. A high IP class (International Protection) may be required in some applications (such as mining, marine or desert) in order to ensure that dust or moist is efficiently prevented from ending up inside the closed compartment. In order to ensure efficient cooling within such a closed compartment 9, the cooling apparatus includes an absorber 3 receiving heated fluid from within the closed compartment 9. This heat is transferred from the fluid to the outside of the closed compartment 9 by the absorber 3. Such transfer may include an airstream passing the absorber 3, for instance. Consequently, the absorber 3 is a heat exchanger transferring heat from the received fluid to the surroundings.

Two fluids having different properties are circulated within the illustrated cooling apparatus. The fluids should be miscible with each other. Suitable pairs of fluids are, for example:
water and LiBr (Lithium Bromide),
R134a (1,1,1,2-Tetrafluoroethane) and DMAC (Dimethylacetamide),
R124 (1-Chloro-1,2,2,2-Tetrafluoroethane) and DMAC (Dimethylacetamide), and
R134a (1,1,1,2-Tetrafluoroethane) and DMETEG (DiMethyl Ether Tetra Ethylene Glycol).

The fluid channel 7 of the generator 1 is configured to receive a first fluid F1 and a second fluid F2 in liquid state at a high pressure. Heat received from the first electric components 5 is transferred to the fluid in the fluid channel 7. Due to this heat, the second fluid F2, which evaporates at a lower temperature than the first fluid F1, is evaporated while the first fluid F1 remains in a liquid state. The vaporized second fluid F2 in a gas state exits the flow channel 7 via an outlet illustrated in the upper left corner of the generator 1, and enters the third condenser 4 via a pipe. The first fluid F1 remaining in a liquid state is forwarded from the generator 1 to the absorber 3. A separator 10 for separating the first F1 and second F2 fluids from each other may be integrated into the generator 1, or alternatively, implemented as an external device between the generator 1 and the absorber 3. Such an external separator may include or consist of a tank with appropriate size and connections arranged at different heights such that separation is carried out by utilizing gravity.

The condenser 4 receives the vaporized second fluid F2 in a gas state from the generator 1. In the condenser 4, the second fluid F2 is cooled such that it condensates, after which it is forwarded to a first expansion device 11 in a liquid state. Cooling may be implemented by the condenser 4 such that it transfers heat from the second fluid F2 to a medium temperature coolant F3 absorbing the heat from the fourth cooling element. A suitable coolant may be air, water, Carbon Dioxide CO2, Helium He or Hydrogen H2, for instance. Consequently, heat is transferred to surroundings outside of the closed compartment 9. For this purpose, the condenser 4 may have a surface provided with fins, and heat is transferred via the fins to surrounding air, such as into an airflow, for instance.

The first expansion device 11 receives the second fluid in liquid state at a first pressure. The pressure is reduced to a predetermined low pressure which is lower than the first pressure. A suitable low pressure may be a predetermined saturation pressure selected according to the properties of the second fluid F2, which is forwarded to the second cooling element 2 as a liquid. One alternative is to implement the expansion device as a simple capillary sized tube in spiral, a valve or a diaphragm such that a large pressure drop is obtained over a small volume.

The fluid channel 8 of the evaporator 2 receives the second fluid F2 in a liquid state. The second fluid F2 is heated in the fluid channel 8 with heat from the second electric components 6. Due to the low pressure of the fluid F2, only a relatively small temperature raise of the second fluid F2 is needed in order to vaporize it. Consequently, adequate cooling can be obtained for the second electric components 6. The vaporized second fluid F2 is forwarded in a gas state and with a low pressure to the absorber 3.

The absorber 3 receives the first fluid F1 in a liquid state from the generator 1 and the second F2 fluid in a vaporized gas state from the evaporator 2. In the absorber 3, the first F1 and second F2 fluids come into contact with each other and the fluids are cooled by the absorber 3, which transfers heat from the fluids to a medium temperature coolant F3 absorbing the heat from the third cooling element. An exemplary coolant may be air, water, Carbon Dioxide $CO_2$, Helium He or Hydrogen $H_2$. Consequently, heat is transferred to surroundings outside of the closed compartment 9. For this purpose, the absorber 3 may have a surface provided with fins, and heat is transferred via the fins to surrounding air, such as into an airflow, for instance. According to an exemplary embodiment, such cooling elements release approximately equal amounts (50%-50%) of heat to the outside of the closed compartment.

As the first fluid F1 and the second fluid F2 have been selected such that they are miscible, the second fluid F2 in a gas state is absorbed in the absorber 3 by the first fluid F1 which is in the liquid state. The mixture of the first F1 and second F2 fluids is provided to the generator 1 from the absorber 3.

In the example of FIG. 1, additional components which may not be necessary in all exemplary embodiments have been illustrated. A heat exchanger 12 with two fluid channels 13 and 14 may be included. The first fluid channel 13 passes the first F1 and second F2 fluids from the absorber 3 to the generator 1, and the second fluid channel 14 passes the first fluid F1 from the generator 1 to the absorber 3. Such a heat exchanger 12 makes it possible to improve the performance (increase of the absorption coefficient) of the absorber 3 by lowering the temperature of the first fluid F1 before it reaches the absorber 3.

Additionally, a pump 15 may be utilized in order to increase the pressure of the first F1 and second F2 fluids before they are introduced into the generator 1.

The example of FIG. 1 also includes a second expansion device 16, which receives the first fluid F1 in a high pressure liquid state from the generator at a second pressure, reduces the pressure of the second fluid F1, and forwards to the absorber 3 the first fluid in a liquid state and with a low pressure, which is lower than the second pressure.

In order to ensure that the cooling apparatus of FIG. 1 works optimally, attention may be placed on the physical location of the various components. To obtain an optimal result, the condenser 4 may be located at a point higher than the other components. The generator 1 may be located lower, however, the absorber 3 may be located at a lower point than the generator 1.

In order to ensure efficient circulation of the fluids in all situations the following relations should apply:
T1>T3>T2, where T1 is the operating temperature of the first electric components 1, T3 is the temperature of the coolant F3 cooling the condenser 4, and T2 is the temperature of the second electric components 6, P4+P3=P1+P2, where P3 and P4, respectively are the heat loads (power) transferred from the absorber 3 respective condenser 4 via the coolant F3 to the outside of the apparatus, P1 is the heat load generated by the first electric components 1 and P2 is the heat load generated by the second electric components 2, the temperature of the coolant cooling the absorber 3 is approximately the same as the temperature of the coolant cooling the condenser 4, and the mechanical work (W) of the pump 15 is so that W<<P4+P3=P1+P2.

With the above-described solution, an efficient cooling apparatus can be obtained that is capable of utilizing evaporation even though no compressor with high-energy consumption (as compared to an ordinary pump) is needed. Instead, it becomes possible to utilize wasted thermal energy from various components to drive the cooling cycle.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A cooling apparatus for electric equipment, the apparatus comprising:
   a closed compartment;
   first and second electric components arranged inside of the closed compartment, an operating temperature of the second electric components being lower than an operating temperature of the first electric components;
   an absorber arranged outside of the closed compartment, the absorber being configured to receive heated fluids from within the closed compartment, and transfer heat from the heated fluid to the outside of the closed compartment;
   a condenser arranged outside of the closed compartment, the condenser being configured to receive heated fluid from within the closed compartment and transfer heat from the heated fluid to the outside of the closed compartment;
   a generator arranged in the closed compartment, the generator comprising a fluid channel configured to receive a first fluid and a second fluid in a liquid state, the first and the second fluids being miscible, to heat the received liquids with heat received from the first electric components, to provide the condenser with the vaporized second fluid in a gas state, and to provide the absorber with the first fluid in a liquid state;
   a first expansion device configured to receive the second fluid from the condenser in a liquid state at a first pressure, reduce the first pressure of the second fluid, and forward the second fluid in a liquid state and with a third pressure which is lower than the first pressure;
   an evaporator arranged in the closed compartment, the evaporator comprising a fluid channel configured to receive the second fluid from the first expansion device in a liquid state, to evaporate the second fluid with heat received from the second electric components, and to forward the evaporated second fluid in a gas state to the absorber;
   a second expansion device configured to forward the first fluid in a liquid state from the generator to the absorber, to receive the first fluid at a second pressure, to reduce the pressure of the first fluid, and to forward to the absorber the first fluid with a fourth pressure which is lower than the second pressure,
   wherein the absorber is configured to receive the first fluid in a liquid state from the generator, the second fluid being in a vaporized gas state from the evaporator, to absorb the vaporized second fluid by the first fluid in a liquid state to obtain a liquid of the miscible first and second fluids while transferring heat from the fluids to the outside of the closed compartment, and to provide the generator with the first and second fluids in a liquid state, and
   wherein the apparatus comprises a pump configured to increase for increasing a pressure of the first and second fluids provided by the absorber to the generator.

2. A cooling apparatus according to claim 1, wherein the first electric components include electric components with higher heat losses than the second electric components.

3. A cooling apparatus according to claim 1, wherein the first electric components include high power electronic devices, and the second electric components include passive electric components.

4. A cooling apparatus according to claim 1, comprising:
   a heat exchanger having a first fluid channel configured to pass the first and second fluids from the absorber to the generator, and a second fluid channel configured to pass the first fluid from the generator to the absorber.

* * * * *